United States Patent
Chang et al.

(10) Patent No.: US 6,861,103 B2
(45) Date of Patent: Mar. 1, 2005

(54) SYNTHESIS OF FUNCTIONAL POLYMERS AND BLOCK COPOLYMERS ON SILICON OXIDE SURFACES BY NITROXIDE-MEDIATED LIVING FREE RADICAL POLYMERIZATION IN VAPOR PHASE

(75) Inventors: Ying Chih Chang, Atherton, CA (US); Jun Li, Irvine, CA (US); Xiaoru Chen, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 31 days.

(21) Appl. No.: 10/360,443

(22) Filed: Feb. 7, 2003

(65) Prior Publication Data

US 2003/0219535 A1 Nov. 27, 2003

Related U.S. Application Data

(60) Provisional application No. 60/355,733, filed on Feb. 7, 2002.

(51) Int. Cl.[7] .................................................. C08F 2/46
(52) U.S. Cl. .................... 427/522; 526/220; 526/303.1; 526/304; 526/317.1; 526/346; 427/255.11; 427/255.14; 427/487; 427/593
(58) Field of Search .............................. 526/220, 303.1, 526/304, 317.1, 346; 427/255.11, 255.14, 487, 522, 593

(56) References Cited

U.S. PATENT DOCUMENTS

| | | | |
|---|---|---|---|
| 6,218,004 B1 * | 4/2001 | Shaw et al. ................. | 428/336 |
| 6,428,861 B2 * | 8/2002 | France et al. ............... | 427/488 |
| 6,468,667 B1 * | 10/2002 | Chabrecek et al. ......... | 428/532 |
| 2002/0122872 A1 * | 9/2002 | Leukel et al. | |
| 2003/0143335 A1 * | 7/2003 | Qiu et al. | |

* cited by examiner

Primary Examiner—Helen L. Pezzuto
(74) Attorney, Agent, or Firm—Daniel L. Dawes; Myers Dawes Andras & Sherman LLP

(57) ABSTRACT

Nitroxide mediated free radical polymerization of vaporized vinyl monomers, including acrylic acid (AAc), styrene (St), N-2-(hydroxypropyl)methacrylamide (HPMA) and N-isopropyl acrylamide (NIPAAm), on silicon wafers is demonstrated. FTIR, ellipsometry and contact angle goniometry were used to characterize the chemical structures, thickness and hydrophilicity of the films. The growth of film is linearly proportional to its reaction time, leading to the easy and exact control of polymer film thickness from nanometers to submicrons. The capability of polymerizing various monomers allows us to fabricate various functional polymer brushes. The reversible thermo-responsiveness of a 200 nm thick grafted poly(NIPAAm) film in aqueous solution is demonstrated with over 50% change in thickness at its lower critical solution temperature. A tri-block copolymer of poly(AAc)-b-polySt-b-poly(HPMA) is successfully synthesized, proving the renewability of TEMPO-mediated polymerization at vapor phase. Surface polymer composition and morphology is thus controlled at nanoscale by utilizing vapor phase surface-initiated controlled polymerization.

18 Claims, 10 Drawing Sheets

Vaporized Acrylic Monomers

, $T \approx T_{vap}$

| Polymer | Thin Film Systems | R1 | R2 |
|---|---|---|---|
| PAA (1) | Poly (acrylic acid) | -H | -COOH |
| PSt (2) | Polystyrene | -H | -Ph |
| PHPMA (3) | Poly [N-(2-hydroxypropyl) methacrylamide] | -Me | -NHC(O)CH(OH)Me |
| | Diblock Copolymer (1,2)   PAA-PSt | | |
| | Diblock Copolymer (2, 1)   PSt-PAA | | |
| | Tri-Block Copolymer (1,2,3)   PAA-PSt-PHPMA | | |

The reaction condition: P < 0.001 Torr, Temperature range: T ~ Boiling temp of monomers, Ts ~ 90~100°C

- The temperature control on TEMPO-substrate as well as the monomer source (acrylic acid) proves to be both important.
- Having the substrate at 90~100oC, a full coverage of PAA film can be synthesized in just 5 minutes.

SYNTHESIS OF FUNCTIONAL POLYMERS AND BLOCK COPOLYMERS ON SILICON OXIDE SURFACES BY NITROXIDE-MEDIATED LIVING FREE RADICAL POLYMERIZATION IN VAPOR PHASE

RELATED APPLICATIONS

The application is related to U.S. Provisional Patent Application, Ser. No. 60/355,733, filed on Feb. 7, 2002, incorporated herein by reference and to which priority is claimed pursuant to 35 USC 119.

BACKGROUND OF THE INVENTION

1. Field of the Invention

The invention relates to the field of nitroxide mediated free radical polymerization of vaporized vinyl monomers, including acrylic acid (AAc), styrene (St), N-2-(hydroxypropyl)methacrylamide (HPMA) and N-isopropyl acrylamide (NIPAAm), on silicon wafers.

2. Description of the Prior Art

Fabrication of polymer ultrathin films with controllable surface properties is critical in many important industrial applications and academic research. As device sizes continue to shrink, the use of surface-initiated polymerization, where polymer films were directly polymerized from surface premodified initiator layers, has become increasingly important over conventional coating methods. The polymer films fabricated via the surface-initiated polymerization are end-grafted monolayers with superior chemical/mechanical stability and controllable grafting thickness and density. Typically, polymerization schemes were directly adapted from the already existed chemical synthetic schemes for their counterpart polymeric materials. However, in a surface-initiated polymerization scheme, the initiators are crowded on a two-dimensional surface and the polymerization only take place at interfaces. This inherent nature has often raised difficulty in synthesizing high molecular weight polymer products in that the effective monomer to initiator ratio near surface is lower, while the premature termination caused by impurities or side reactions in solution are more dominant than the typical polymerization where both monomers and initiators are evenly dispersed in the media. Previously, empirical methods such as adding excess initiator molecules in solution phase were proposed to improve the yield.

The prior art has described the synthesis of polymer brushes by living free radical polymerization using another similar alkoxylamine initiator, but it was performed in liquid phase. The reaction performed in liquid is quite different from that in gas phase. There have been some limited work on the synthesis of polymer (polypeptide) brushes by living polymerization using quite different initiators. Besides they used condensation polymerization techniques instead of addition polymerization in our system.

As with preparation of self-assembled monolayers (SAMs), polymer brushes are typically formed by first depositing initiating groups on a substrate surface that covalently bind thereto. Then, macromolecular chains are grown from the initiating groups using monomers that are typically similar to those traditionally used in microlithography, e.g., t-butyl acrylate. The covalent bonding of the macromolecular chains to the substrate surface opens up a number of possibilities that are not available with traditional spin-cast films. These advantages permit the use of these films in technological applications that include specialty photoresists, sensors and microfluidic networks.

A number of different approaches to synthesis of patterned polymer brushes have been described. For example, some have reported the patterning of surface bound initiators by either photoablation or photoinitiation, followed by polymerization to give discrete areas of polymer brushes, while others have detailed the growth of patterned polymer films using layer by layer techniques. In addition, a number of groups have also reported the elaboration of microcontact printed thiol monolayers to provide patterned polymer brushes.

In the past, studies have been done on graft polymerization for surface modification, but the main difficulty was the poor controlling of composition, architecture and function of the polymer layer. The appearance of living polymerization provided the chance of changing this situation. In the recent years, efforts have been made by the combination of graft polymerization and living polymerization, some have succeeded. Usually they were not highly efficient in initiating graft polymerization and applicable to various monomer systems. Most importantly, they were not good in patterning the polymer layer due to the limitation of solvent in most systems.

Ever since the nitroxide-mediated radical polymerization was proposed by M. K. Georges et al in 1994, it has been widely investigated in many polymeric systems. It is a very attractive approach to synthesize not only living homopolymers but also block-copolymers, as a result of its living characteristic. More recently, this approach has also been used to synthesize polymer from an immobilized TEMPO initiator layers at surfaces, thus creating an end-grafted polymer thin film layer as shown by Husseman, et al in 1999.

BRIEF SUMMARY OF THE INVENTION

In the illustrated embodiment of the invention vaporized acrylic monomers are used, as opposed to the solvated monomers, as the source for synthesizing end-grafted block copolymer ultrathin films on solid substrates. Conceptually, polymerization at vapor provides a means to reduce the consumption of solvents, to eliminate time to purge off $O_2$, to shorten the reaction time, and to more easily pattern the surfaces.

The illustrated embodiment is directed to a fabrication method for organic ultrathin films (1~100 nm) by utilizing vapor deposition polymerization in vacuum. A variety of polymer brushes grafted on silicon oxide surfaces are fabricated through the living polymerization of vaporized vinyl monomers from the surface initiator layer. In particular, a derivative of 2,2,6,6-tetramethyl piperidinyloxy (TEMPO) based alkoxylamine containing trimethoxysilyl is pre-immobilized on the silicon (100) wafer with the TEMPO group at the free end, which is applied for initiating the growth of the grafted polymer layers from the surface via living free radical polymerization. This polymerization is performed in vapor phase instead of the conventional solution phase. To monitor the chemical structures, growth of films, and the surface energy, Fourier transform infrared spectrum (FTIR), ellipsometry and contact angle goniometry are employed. It is found that a thickness up to sub-micron is attainable within less than 2 hours. A nearly linear relationship between the polymer film thickness and the reaction time enables an easy and exact control of the resulting polymer thickness. In addition, the polymers with various chemical functional groups, including phenyl, carboxyl, amide, and hydroxyl, are successfully fabricated followed by the same protocol. The fabricated Poly N-isopropyl acrylamide (PNIPAAm) film also exhibits the unique reversible thermo-sensitive feature of a homopolymer in aqueous system. Corresponding to the decrease of temperature across the lower critical solution temperature (LCST) of PNIPAAm, the thickness of PNIPAAm layer extended more than 50% due to the phase transition. Besides, the living character of this polymerization process allows the fabrication of not only di-block copolymers, but also tri-block copolymers such as PAAc-b-PSt-b-PHPMA, demonstrating the feasibility of exact control of surface polymer composition and morphology at nanoscale.

The invention relates generally to:

1. a fabrication method for creating polymer thin films with controlled properties;
2. a fabrication method utilizing free radical polymerization of vaporized vinyl monomers in vacuum to synthesize wide variety of polymer thin films;
3. a fabrication method combined with photolithography for creating surface patterns;
4. a composition of matter for polymeric materials including polystyrene (PS), polymers with functional groups such as hydroxy, carboxy, and amide, and/or block copolymers composed of more than two of the above mentioned polymers;
5. a thin film with a thickness controlled from 1 nm up to submicron sizes; and
6. a method for creating "smart surfaces", where surface properties can be regulated through the environment stimulants and become fully reversible/recyclable as a product.

The invention relates to the synthesis of graft functional polymers and block copolymers on solid surface in vapor phase. Using the specially synthesized alkoxylamine initiator covalently immobilized on silicon wafer to initiate living free radical polymerization in vapor phase, functional polymers or block copolymers layers are fabricated. The purpose or the invention is to synthesize graft polymers with well-defined composition, architecture and function for surface modification. The obtained surface layer not only contains the designed surface properties such as hydrophobicity or hydrophilicity and functional groups, but also has precise structure or even pattern. It is applicable to most vinyl monomers. It is a kind of nitroxide-mediated living free radical polymerization, and based on a vapor deposition technique, it is performed in vapor phase instead of conventional liquid phase.

The method of the invention is applicable to most of the vinyl monomers, which offers more opportunity in fabricating polymer layers with various functions. The stimuli-responsive polymer layers can be obtained easily. The thickness of the fabricated polymer is well controlled from a few nanometers up to submicron thicknesses. Block copolymers are easily produced. Finally, the solvent free process due to the vapor phase polymerization greatly favors the surface patterning since it avoids the adverse effect on photomasks.

One of the promising fields for the present invention is in the field of biochips. The capability of precisely controlling composition and architecture of surface polymer layers together with the fine patterning techniques can produce chips with well-patterned biomolecules for diagnosis and treatment. It is advantageous also for patterning on silicon and metals with nanometer thickness which opens a large market in microelectronics. Besides, the invention can be used in many other areas such as microfluidics, separation, optics, and the like.

One advantage of the invention compared to the prior art methods is that the invention produces a product which is a much more densely packed, self-regulating (sensing), and fully recyclable. The resulting polymer thin films can be widely used for biochips, coatings on biomedical devices for improving biocompatibility, for coating a surface for antifouling, and anti-corrosion.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112. The invention can be better visualized by turning now to the following drawings wherein like elements are referenced by like numerals.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE PREFERRED EMBODIMENTS

In the illustrated embodiment a vapor phase reaction scheme is used to synthesize grafted polymer thin films. Inspired by the success of gas phase reactions, such as chemical vapor deposition (CVD) evaporation, and sputtering, in semiconductor and metallic thin film fabrication, a vapor phase scheme, if chemically feasible, has many advantages over the conventional solution phase reactions in synthesizing high molecular weight thin film materials.

First, the vacuum environment can greatly eliminate impurities and solvent molecules, thus prolonging the mean free path of vaporized monomers reaching down the initiator-modified surfaces.

Second, a more efficient surface reaction can be facilitated in that vaporized monomers possess higher thermal energy and can be directional if desired.

Third, the reaction parameters such as the evaporating temperature of monomers, the substrate temperature, degree of vacuum, concentration of monomers, type of monomers, etc, can be adjusted independently and quickly in a vapor phase reaction. Potentially, the vapor phase reaction could be a more versatile method in fabricating polymer films with patterns and multiple compositions in three dimensions. This argument has been experimentally confirmed in the case of ring-opening polymerization of N-carboxy anhydrides (NCAs) of amino acids from the surface initiators. When the parameters were optimized, the thickness of the grafted polypeptide film synthesized via the so-called "surface initiated vapor deposition-polymerization" (SI-VDP) is 10-fold higher than those were produced in the solution phase polymerization.

Figure 5:
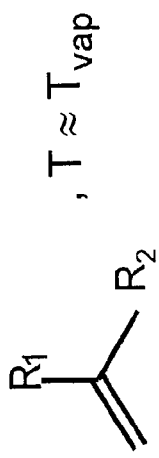
FIG. 5 is a table summarizing the vaporized acrylic monomers used in the illustrated embodiment.

To demonstrate the feasibility of SI-VDP of monomers which were typically in solvated or liquid forms previously, we have chosen nitroxide-mediated free radical polymerization of vinyl monomers as the model system as diagrammatically summarized in FIG. 5. This reaction scheme has been demonstrated as a living (or "controlled") polymerization in solution phase for some industrially important monomers such as styrene, and its surface-initiated protocol has been successfully developed previously. Hence, the selection allows us to investigate both synthetic capability as well as the "controlled" feature of this important polymer category in an SI-VDP setup. To do so, various vaporized vinyl monomers, including styrene, acrylate and acrylamide, were used to synthesize both homo- and block co-polymer brushes as described below.

The initiator, 1-(4-oxa-2'-phenyl-12'-trimethoxysilyl dodecyloxy)-2,2,6,6-tetramethyl-piperidine (I) (TEMPO), was synthesized and pre-deposited on a silicon (100) native oxide surface via the silanol condensation reaction of trimethoxysilane head groups. The modified silicon substrate was placed in a vacuum chamber containing a small amount of monomers. At least 8 mm displacement between the substrate and monomer source was placed to ensure no direct contact. The chamber was evacuated under $10^{-3}$ Torr and sealed, and the temperature was elevated at 125° C. to activate TEMPO initiators, and to vaporize monomers. After the reactions, the samples were cleaned thoroughly to remove loosely-bound physisorbed materials followed by conventional cleaning procedures.

Figure 1:
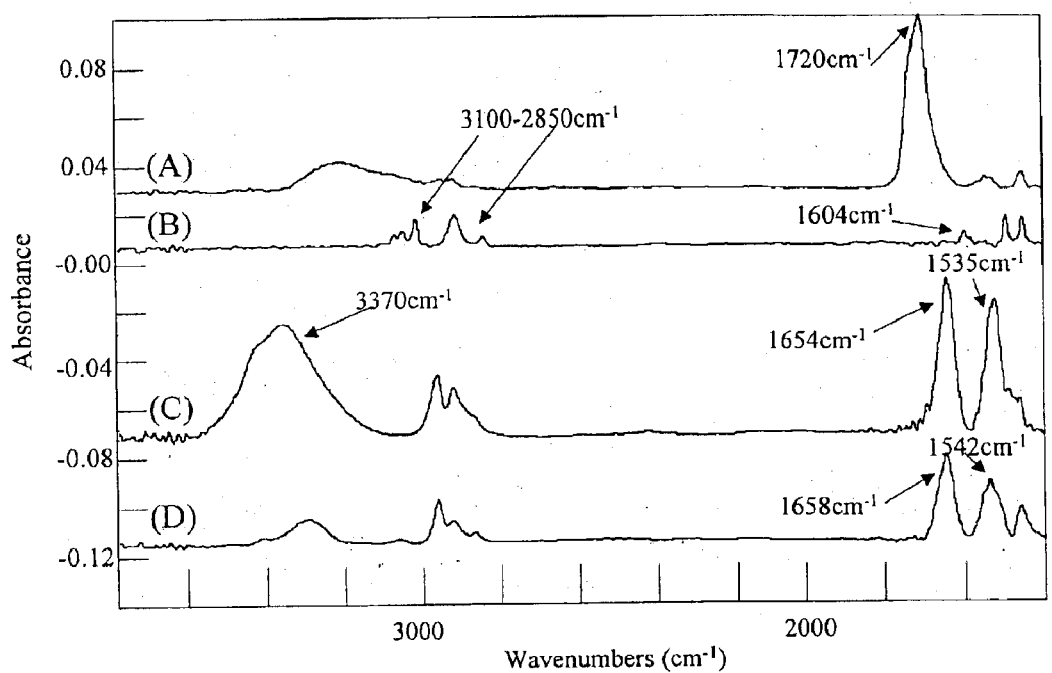
FIG. 1 is a graph showing the FTIR spectra for silicon wafers grafted with line (A) corresponding to PAAc (30 nm, reaction time: 18 min), line (B) corresponding to PSt (150 nm, 2 h), line (C) corresponding to PHPMA (12 nm, 2 h), and line (D) corresponding to PNIPAAm (29 nm, 5 h).

Poly(acrylic acid) (PAAc) brushes were first fabricated on silicon wafers by the SI-VDP of vaporized acrylic acid (AAc) monomers. The successful fabrication of the film was confirmed by its transmission Fourier transform infrared spectrum (t-FTIR), which has the identical characteristic peaks such as the strong absorbance at 1720 $cm^{-1}$ attributed to carboxylic side chains to the standard PAAc material. Line (A) in FIG. 1 shows the t-FTIR spectrum of one particular grafted PAAc sample synthesized by the SI-VDP for 18 min. The corresponding film thickness of the grafted sample measured by Ellipsometer is 30 nm.

Other monomers, including styrene (St), N-(2-hydroxypropyl)methacrylamide (HPMA) and, N-isopropyl acrylamide (NIPAAm), were also applied in the SI-VDP scheme. Lines (B), (C), and (D) in FIG. 1 are the spectra of the corresponding polymer films respectively. The characteristic peaks from each spectrum match the corresponding polymer standard, thus confirming the feasibility of applying these vaporized monomers in a TEMPO-initiated radical polymerization. Simultaneously, X-ray photoelectron spectroscopy (XPS) was employed to examine the surface composition of grafted PAAc, PSt, and PHPMA films, and the surface elemental analysis based on the individual XPS scans is summarized in Table 1. The experimental compositional ratios are in good agreement with the theoretical stoichiometric ratios of each polymer species, further confirming the results from FTIR.

TABLE 1

XPS data of polymers grafted on silicon wafer

| Sample | Reaction time | Ellipsometric thickness (nm) | Surface composition $N_{C(1s)}:N_{N(1s)}:N_{O(1s)}: N_{Si(2p)}$ | |
|---|---|---|---|---|
| | | | XPS experimental | Theoretical value of pure polymer sample |
| PAAc | 0.5 h | 61 | 61:0:39:0 | 60:0:40:0 |
| PSt | 1 h | 84 | 74:0:18:8 | 100:0:0:0 |
| PHPMA | 5 h | 26 | 67:10:23:0 | 70:10:20:0 |

* The presence of O(1s) is attributed by the silicon oxide substrate (SiO$_x$), indicating the presence of defects in this particular sample.

We also performed the surface polymerization of above-mentioned monomers in solution phase in order to compare the results with those from the SI-VDP schemes. By adjusting the reaction parameters appropriately, we were able to fabricate grafted PMc, PSt and PHPMA thin films in both vapor and solution phase with comparable results. However, to date we have not been able to produce grafted PNIPAAm films in any circumstances. For example, we have tried the polymerization in different solutions including water, alcohol, toluene, and dioxane, but none of them generates surface-bound PNIPAAm brushes. This suggests that the SI-VDP technique does offer unique advantages for the polymer systems that are difficult or impossible to obtain in conventional solution phase.

With the successful fabrication of grafted PNIPAAm via the SI-VDP, for the first time, we are able to study the temperature response of this thermal-sensitive polymer in an end-grafting state. PNIPAAm is known to reversibly expand when temperature is below its lower critical solution temperature (LCST) in the aqueous solution. Therefore, a film of grafted PNIPAAm is anticipated to change its dielectric properties (such as film thickness and refractive index) with temperature. Indeed, using ellipsometry to measure the thickness of the PNIPAAm film in situ, we found that the solvated PNIPAAm film with an original thickness of 120 nm (>32° C.) can expand over 200 nm (<32° C.) below its LCST point as illustrated in FIG. 2.

Figure 2:
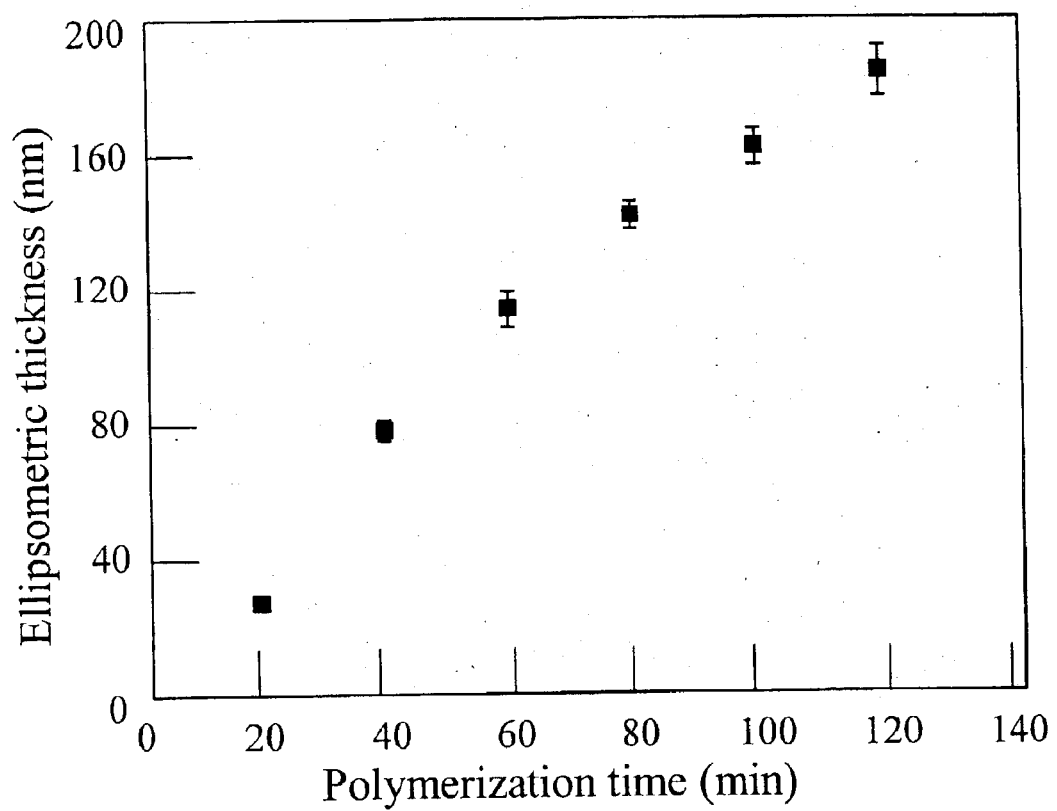
FIG. 2 is a graph showing the dependence of the thickness of PAAc grafted on silicon wafer on polymerization time

The kinetic plot of ellipsometric film thickness of the resulting grafted PAAc film versus polymerization time, as shown in FIG. 2, demonstrates that the SI-VDP via nitroxide-mediated polymerization scheme is effective in synthesizing PAAc films. Within a 2 h reaction, a film of nearly 200 nm thickness was obtained. While the monomer concentration in solution polymerization decreases as the reaction progresses, in a SI-VDP setup, the vaporized monomer concentration remains constant throughout the reaction. According to Rault's law, as far as there is condensed monomer in excess, the monomer is saturated at vapor phase in equilibrium state. Accordingly, the average chain molecular weight of the film is proportional to the rate of polymerization.

Figure 10:
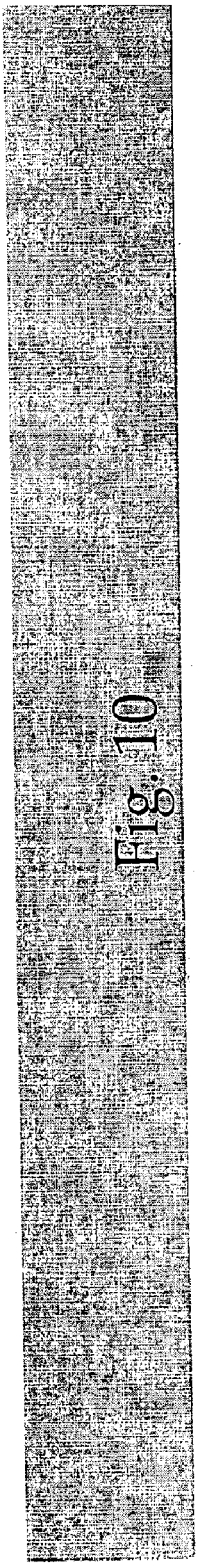
FIG. 10 illustrates the ellipsometric thickness of the film as a function of polymerization time of PAA.
Figure 10:
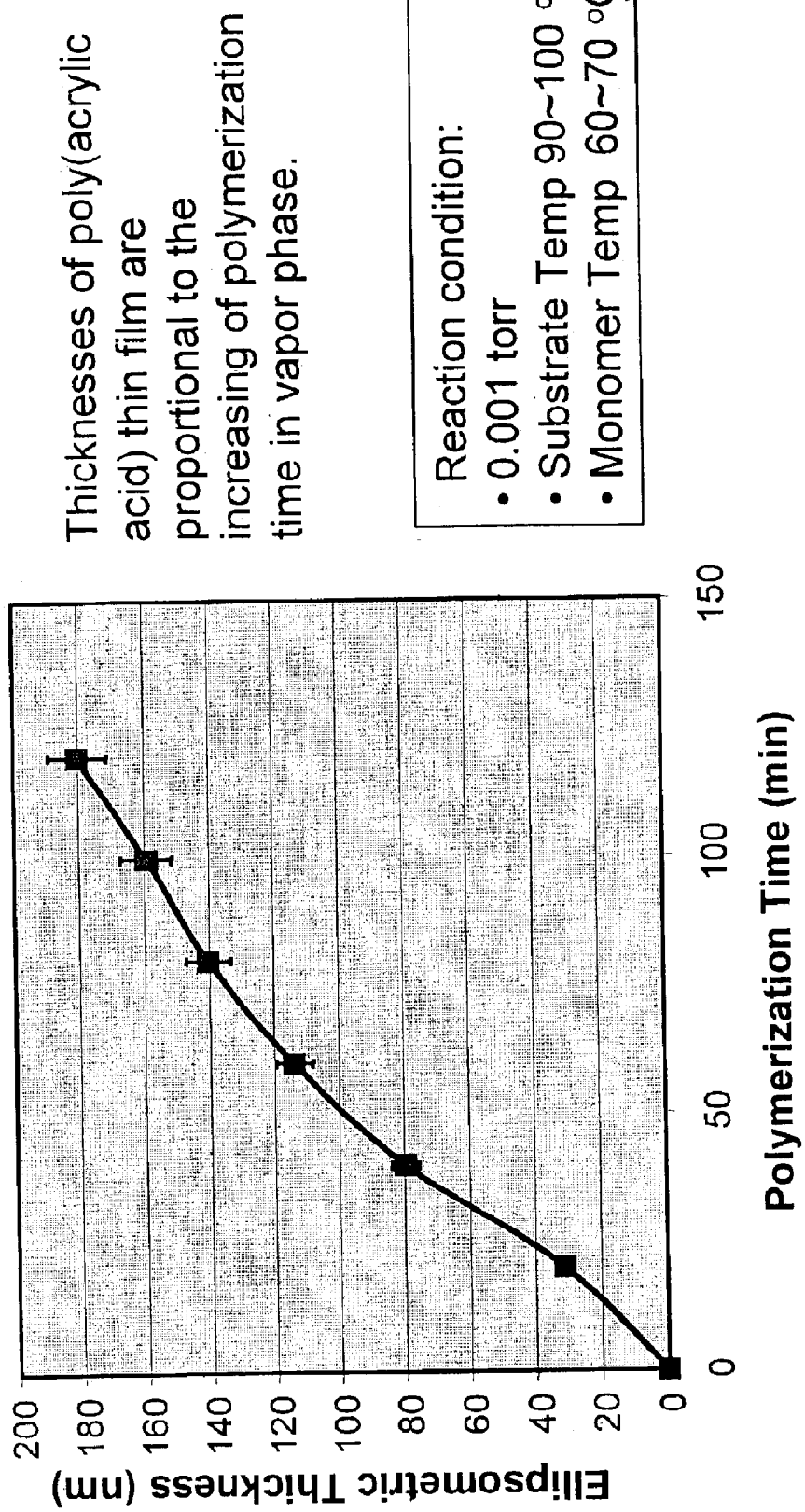

As shown in FIG. 2, within 2 h, the polymer thickness and reaction time remains linearly proportional, confirming our hypothetical model. The linear relationship allows one to control the resulting thicknesses by controlling the reaction time. FIG. 10 illustrates the ellipsometric thickness of the film as a function of polymerization time of PAA.

Although we have not fully optimized the reaction conditions for each polymer system, the current results show that the grafting efficiency is highly dependent upon the side chain groups. For example, the grafted PAAc or PSt films required less time than the grafted PHPMA or PNIPAAm films to reach the same thickness level, i.e. 150 nm thickness of PAAc or PSt film was generated in 2 h.

One unique feature of nitroxide-mediated free radical polymerization is the presence of dormant alkoxyamine groups at the chain ends of the formed polymers (mainly styrene-based polymers), which is capable to re-initiate polymerization to create a second block of polymer when the reaction conditions are resumed.

Figure 3:
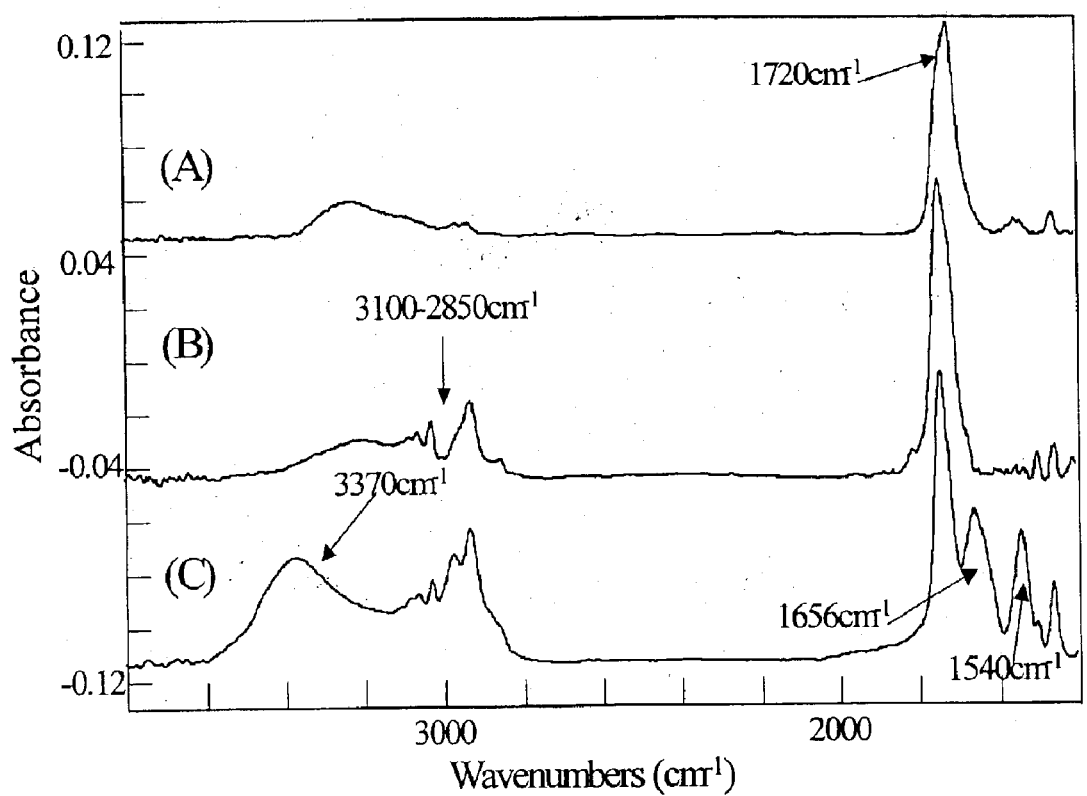
FIG. 3 is a graph of the FTIR spectra of the grafted thin film samples after sequential polymerizations. Line (A) shows the spectrum after first polymerization from the TEMPO initiator: PAAc homopolymer (30 nm, 18 min), and Line (B) shows the spectrum after second polymerization from the PAAc film: Di-block PAA (30 nm, 18 min)-b-PSt (25 nm, 1 h), and line (C) shows the spectrum after third polymerization from the diblock film: Tri-block PAA(30 nm, 18 min )-b-PSt (25 nm, 1 h)-b-PHPMA (10 nm, 3 h).

Because such a "living" characteristic is important toward controlling surface composition and morphology at nanoscale, it would be of great interest if the SI-VDP protocol also remains "renewable". In our case, we conducted SI-VDP for multiple cycles to demonstrate its renewability. By two sequential polymerization, the amphiphilic monolayer composed of grafted diblock copolymers of PAAc (the $1^{st}$ layer)-b-PSt (the $2^{nd}$ layer), or PSt (the $1^{st}$ layer)-b-PAAc (the $2^{nd}$ layer) were fabricated. More strikingly, by three sequential polymerization, the grafted triblock copolymer of PAAc (30 nm, the $1^{st}$ layer), PSt (25 nm, the $2^{nd}$ layer) and PHPMA (10 nm, the $3^{rd}$ layer) was demonstrated. The t-FTIR spectra in FIG. 3 show the sequential formation of the triblock copolymer. The water contact angles of the surfaces after each polymerization cycle, as indicated in Table 2, are the complementary evidence of successful grafting of each layer: The grafting of PAAc or PHPMA as the outmost layers led to a hydrophilic surface, while PSt led to a hydrophobic one. The creation of a hydrophilic-hydrophobic-hydrophilic alternating polymer thin film clearly confirms the renewal capability of TEMPO-initiated polymerization at vapor phase.

TABLE 2

Advanced water contact angle after sequential surface reactions

| Treatment | Clean Si wafer | TEMPO Initiator | PAAc[a] | Diblock[b] | Triblock[c] |
|---|---|---|---|---|---|
| Contact angle (°) | 10 ± 2 | 60 ± 2 | 40 ± 2.5 | 90 ± 2.5 | 49 ± 2.5 |

[a]–[c]Vapor polymerization for the synthesis of [a]PAAc (30 nm). [b]PAAc (30 nm)-b-PSt (25 nm). [c]PAAc (30 nm)-b-PSt (25 nm)-b-PHPMA (10 nm).

In summary, we have successfully demonstrated the applicability of nitroxide mediated polymerization of vaporized vinyl monomers. Through this SI-VDP process, grafted PAAc thin films with thicknesses from few nanometers to submicrons were fabricated within hours. Interestingly, its linear relationship between thickness and reaction time allows one to further predict and control the resulting film thickness.

Figure 6:
FIG. 6 is a table summarizing the fabrication of end-grafted homopolymer thin films using nitroxide mediated radical polymerization in the illustrated embodiment.
Figure 6:
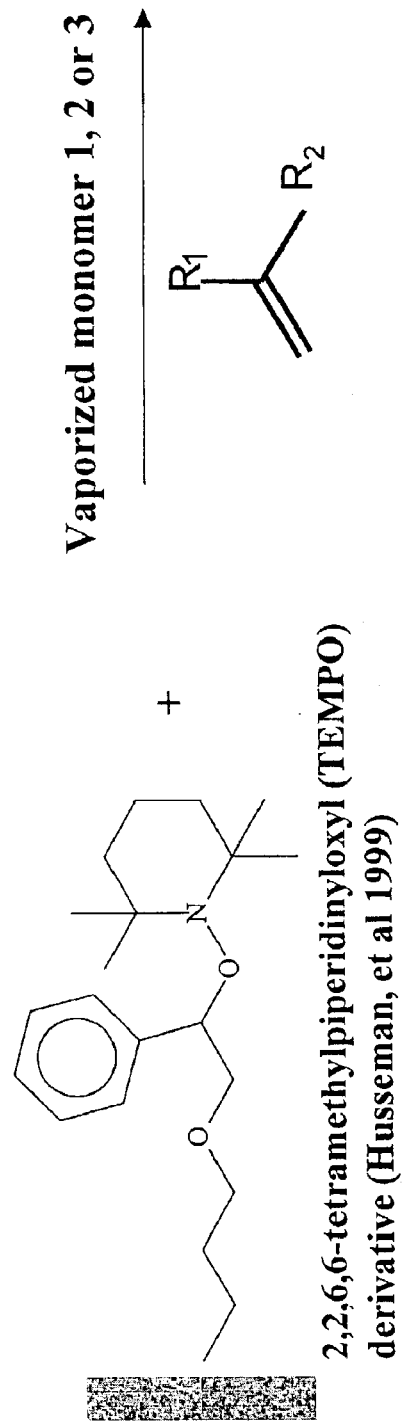
Figure 6:
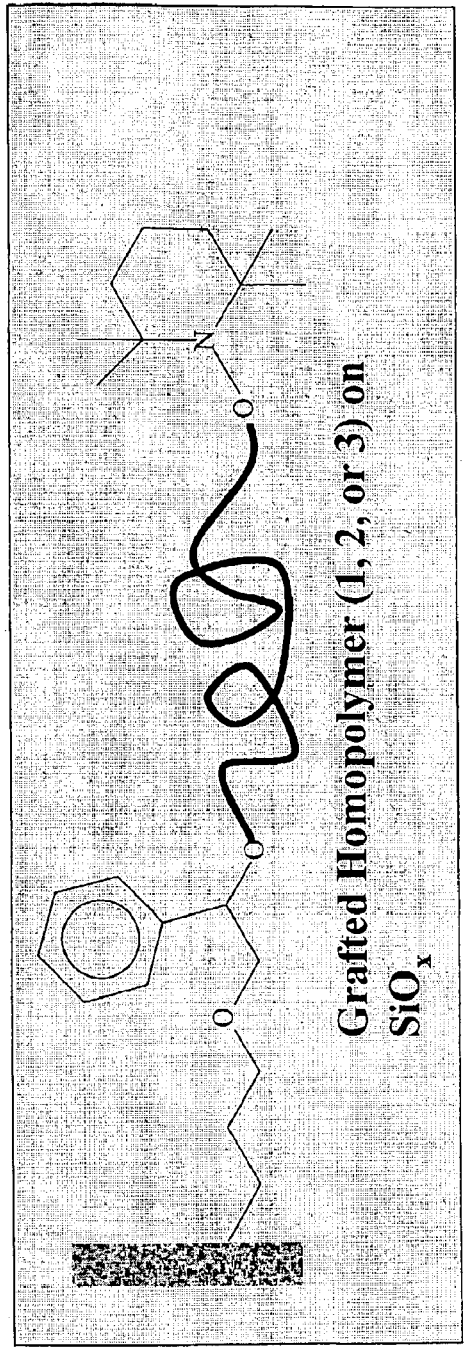
Figure 7:
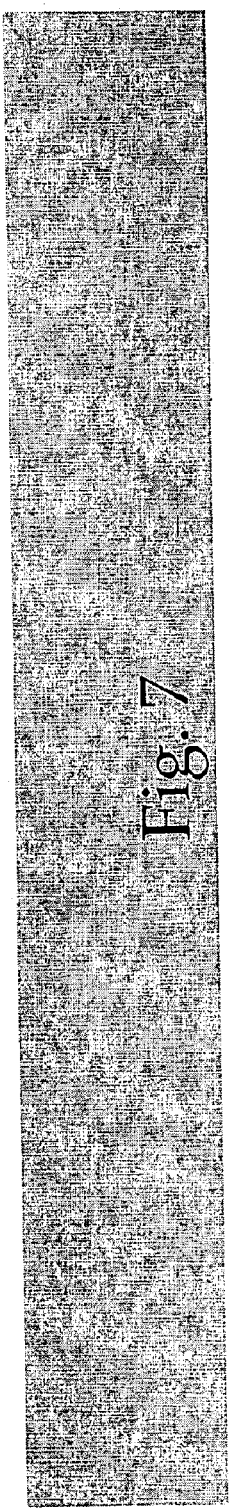
FIG. 7 is a table summarizing the fabrication of block copolymer thin films using nitroxide mediated radical polymerization in the illustrated embodiment.
Figure 7:
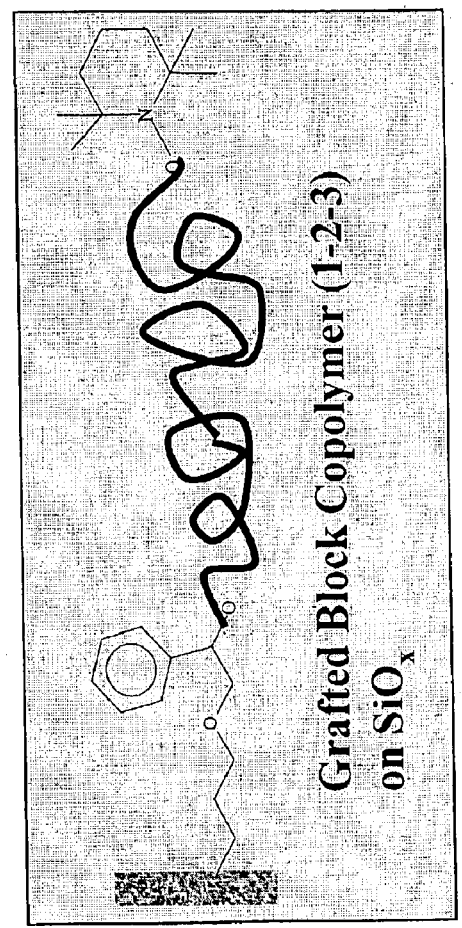

Furthermore, other thin films of homopolymers (PSt, PHPMA, and PNIPAAm) as diagrammatically depicted in FIG. 6 and block copolymers, including the triblock copolymer of PAAc-b-PSt-b-PHPMA, as diagrammatically depicted in FIG. 7 were also obtained successfully.

Finally, the combination of solvent-free process and surface-initiated polymerization does provide not only an environmentally cleaner and more efficient technique for fabricating polymeric thin films than the existing solution polymerization, but also a more flexible protocol for surface patterning. In analogy to the vapor phase process in semiconductor manufacturing, the conventional photolithographic techniques are completely applicable for this fabrication process for organic thin film synthesis, as it avoids the adverse effect on photomasking that usually arises from the interference of solvents.

AN EXAMPLE

Figure 8:
FIG. 8 is a simplified diagram showing a device used for vapor polymerization.
Figure 9:
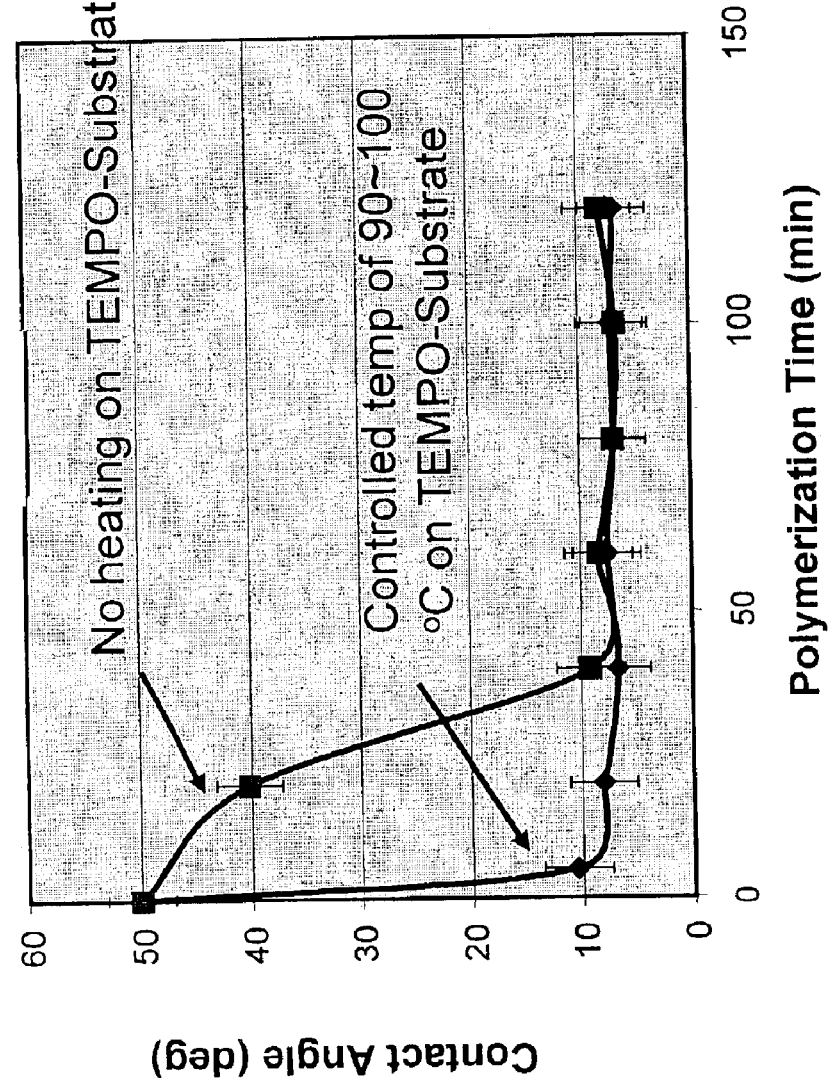
FIG. 9 is a graph showing contact angle as a function of polymerization time demonstrating the heating effect of the TEMPO modified silicon substrate for polymerization of PAA.

An experimental example of one embodiment will make the invention clear. A silicon wafer was cleaned with $H_2O_2/H_2SO_4$(3/7, v/v) and immersed in solution of initiator in anhydrous toluene for 2 h at room temperature. The TEMPO initiator was tethered on the silicon oxide surface 10 through the silanol condensation reaction and confirmed by ellipsometry and contact angle measurements. After extensive washing and drying, the initiator immobilized silicon wafer 12 mounted on a metal plate 22 was placed into a reaction chamber 14 containing small amount of monomers 16 as shown diagrammatically in FIG. 8. The temperature of plate 22 and hence wafer 12 was monitored by a thermocouple 18 and a heater coil 20 was thermally coupled to plate 22 to precisely control the temperature of wafer 12. Oxygen in that reaction chamber 14 was removed completely by repeating at least three cycles of evacuating and then purging with nitrogen. Finally the reaction chamber 14 was evacuated to about $1 \times 10^{-3}$ Torr, sealed and transferred to an oven or oil bath at 125° C. for a designed period. After the reaction, the silicon wafer 12 was cleaned thoroughly with appropriate solvents to remove non-covalently bound species. FIG. 9 illustrates the importance of temperature control of wafer 12 where full coverage of a PAA film can be synthesized in just 5 minutes if wafer 12 is maintained in the range of 90 to 100° C. as opposed to more than 40 minutes if there is no wafer heating.

Figure 4:
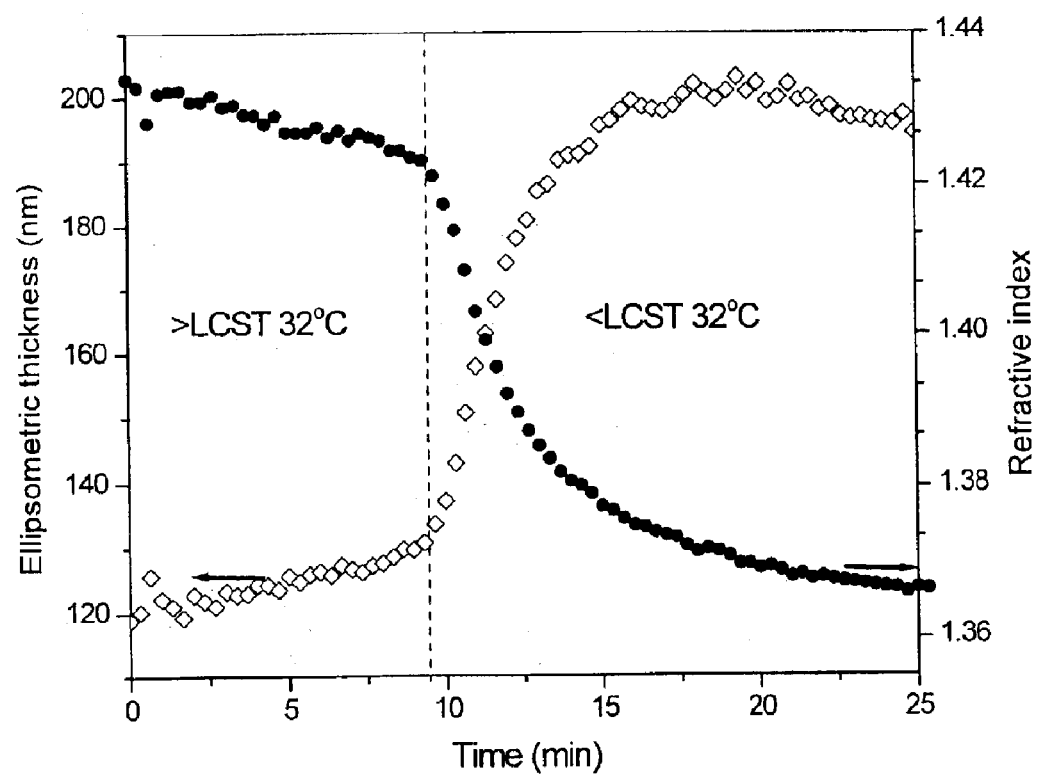
FIG. 4 is a graph which shows the change of the thickness and refractive index of a grafted PNIPAAm film with time in water when the temperature decreases from 50° C. to 22° C. The measured thickness of the PNIPAAm film is 65 nm in air.

The surface-grafted PNIPAAm (65 nm in air) was put into a liquid cell full of water at high temperature (higher than its LCST). During the decrease of temperature with time, the change of PNIPAAm thickness and refractive index in water was measured by ellipsometry as illustrated in FIG. 4.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

We claim:

1. A method for forming organic thin films comprising:
   providing a substrate having a surface;
   covalently pre-immobilizing a derivative of 2,2,6,6-tetramethyl piperidinyloxy (TEMPO) based alkoxylamine containing trimethoxysilyl on the surface of the substrate with the TEMPO group at the free end; and
   growing a grafted polymer layer in vapor phase on the pre-immobilized surface by means of living free radical polymerization.

2. The method of claim 1 where growing the grafted polymer layer in vapor phase comprises growing a Poly N-isopropyl acrylamide (PNIPAAm) film on the substrate in vaporphase.

3. The method of claim 1 where growing the grafted polymer layer in vapor phase comprises growing a diblock polymer.

4. The method of claim 1 where growing the grafted polymer layer in vapor phase comprises growing a triblock polymer.

5. The method of claim 1 where growing the grafted polymer layer in vapor phase comprises linearly controlling the thickness of the grafted polymer layer by controlling reaction time.

6. The method of claim 5 where linearly controlling the thickness of the grafted polymer layer controls the thickness in the range from 1 nm to submicron sizes.

7. The method of claim 1 where growing the grafted polymer layer in vapor phase comprises utilizing nitroxide mediated, free radical polymerization of vaporized vinyl monomers in vacuum to synthesize the polymer thin film.

8. The method of claim 1 further comprising using photolithography to create surface patterns in the thin film.

9. The method of claim 1 further comprising regulating surface properties of the substrate through an environment stimulant.

10. The method of claim 1 where growing the grafted polymer layer in vapor phase comprises forming a thin film of polymeric materials including polystyrene (PS), polymers with functional groups such as hydroxy, carboxy, and amide, and/or block copolymers composed of more than two of the polymers with functional groups.

11. A method for forming organic thin films using surface initiated vapor deposition-polymerization of monomers comprising:
    providing a substrate having a surface; providing an initiator;
    predepositing the initiator on the surface of the substrate;
    disposing the modified substrate in a vacuum containing the monomer;
    activating the initiator; vaporizing the monomer; and
    reacting the monomer to the modified surface with the activated initiator present,
    where providing the initiator comprises synthesizing 1-(4-oxa-2'-phenyl-12'-trimethoxysilyl dodecyloxy)-2,2,6,6-tetramethyl-piperidine (I) (TEMPO).

12. The method of claim 11 where vaporizing the monomer vaporizes acrylic acid (AAc) monomers.

13. The method of claim 11 where vaporizing the monomer vaporizes a monomer selected from the group consisting of styrene (St), N-(2-hydroxypropyl)methacrylamide (HPMA) and, N-isopropyl acrylamide (NIPAAm).

14. The method of claim 11 where reacting the monomer to the modified surface with the activated initiator present grows a thin film at a rate of polymerization where the thin film has an average chain molecular weight proportional to the rate of polymerization.

15. The method of claim 11 where reacting the monomer to the modified surface with the activated initiator present grows a polymer film on the substrate with a film thickness linearly proportional to reaction time.

16. A method for forming organic thin films using surface initiated vapor deposition-polymerization of monomers comprising:
    providing a substrate having a surface; providing an initiator;
    predepositing the initiator on the surface of the substrate;
    disposing the modified substrate in a vacuum containing the monomer;
    activating the initiator; vaporizing the monomer; and
    reacting the monomer to the modified surface with the activated initiator present,
    where reacting the monomer to the modified surface with the activated initiator present forms a polymer film by means of nitroxide-mediated free radical polymerization with dormant alkoxyamine groups at the chain ends of the formed polymers comprising the polymer film, which is capable of re-initiating polymerization to create a second block of polymer when the reaction conditions are resumed.

17. The method of claim 16 further comprising sequentially polymerizing additional blocks of copolymers on the polymer film.

18. The method of claim 17 where sequentially polymerizing additional blocks of copolymers on the polymer film produces a hydrophilic-hydrophobic-hydrophilic alternating polymer thin film.

* * * * *